United States Patent [19]

Pforr et al.

[11] Patent Number: 5,624,773
[45] Date of Patent: Apr. 29, 1997

[54] RESOLUTION-ENHANCING OPTICAL PHASE STRUCTURE FOR A PROJECTION ILLUMINATION SYSTEM

[75] Inventors: Rainer Pforr, Leuven Wilsele; Kurt G. M. Ronse, Damme; Rik M. E. Jonckheere, Muizen; Luc M. M. L. Van Den Hove, Linden, all of Belgium

[73] Assignee: Interuniversitair Micro-Elektronica Centrum vzw, Louvain, Belgium

[21] Appl. No.: 325,286

[22] PCT Filed: Feb. 23, 1993

[86] PCT No.: PCT/BE93/00009

§ 371 Date: Dec. 21, 1994

§ 102(e) Date: Dec. 21, 1994

[87] PCT Pub. No.: WO94/19723

PCT Pub. Date: Sep. 1, 1994

[51] Int. Cl.$^6$ ........................................ G03F 9/00
[52] U.S. Cl. ........................ 430/5; 430/322; 430/324; 430/4; 359/562
[58] Field of Search ............................ 430/4, 5, 322, 430/324; 356/401; 359/562, 564

[56] References Cited

U.S. PATENT DOCUMENTS 5,446,587 8/1995 Kang et al. ........................... 430/5

FOREIGN PATENT DOCUMENTS

| 462560 | 12/1991 | European Pat. Off. . |
| 486316 | 5/1992 | European Pat. Off. . |
| 507487 | 10/1992 | European Pat. Off. . |
| 524741 | 1/1993 | European Pat. Off. . |

OTHER PUBLICATIONS

Patent Abstracts of Japan, vol. 16, No. 065 (P–1313), Feb. 18, 1992 & JP,A,03 259 256, Nov. 19, 1991.

Patent Abstracts of Japan, vol. 17, No. 062 (P–1483), Feb. 8, 1993 & JP,A,04 273 243, Sep. 29, 1992.

*Primary Examiner*—S. Rosasco
*Attorney, Agent, or Firm*—Levine & Mandelbaum

[57] ABSTRACT

In an optical projection system for use in projection printing of masks to wafers, comprising an illumination system including a light source and a mask positioned in the optical path of the illumination system, an optical phase structure is positioned in the optical path between the light source and the mask. The phase structure comprises a pattern of distributed transparent features having at least one refractive index, the transparent features of said phase structure being related in position and orientation to the opaque features of the mask.

16 Claims, 8 Drawing Sheets

RESOLUTION-ENHANCING OPTICAL PHASE STRUCTURE FOR A PROJECTION ILLUMINATION SYSTEM

FIELD OF THE INVENTION

The present invention relates generally to projection photolithography techniques and more particularly to a novel resolution-enhancing optical phase structure to be used in a projection illumination system, as employed for instance in the fabrication of integrated semiconductor components.

BACKGROUND OF THE INVENTION

Projection photolithography techniques are used for the production of photoresists intended for use in the fabrication of large scale integration components. For this purpose, a mask has to be projection printed to a photoresist-covered semiconductor wafer using an optical projection system. The heart of the optical projection system is a projection lens which reduces the pattern contained in the mask onto the resist layer on the semiconductor substrate. The high optical quality of the projection lens makes it possible to obtain the theoretical critical resolution for a narrow monochromatic spectral range.

A conventional transmission mask consists of a glass substrate covered with an opaque chromium layer with apertures to define the desired intensity pattern. The aperture pattern contains the spectrum information of the device geometries to be imaged on the wafer surface. The laws of diffraction cause the light intensity to spread into the dark regions surrounding the light beam. Constructive interference between the light fields diffracted by the apertures in the mask maximizes the intensity between the apertures, thus reducing the resolution of the projection system.

An improvement in resolution and contrast is highly valuable in advanced photolithography in order to meet the requirements of reduction in the lateral dimensions and minimum size of the pattern features of micro-electronic devices. An improved resolution can be achieved by using phase shift technique which needs so-called a phase-shifting mask. The phase-shifting mask differs from the conventional transmission mask in that a transparent phase-shifting layer covers adjacent apertures. The optical waves transmitted through adjacent apertures then follow different phases. If it is arranged that the emerging waves are 180° out-of-phase with one another, destructive interference minimizes the light intensity between their images at the wafer surface, thus resulting in an improved resolution and contrast. However, phase-shifting masks are costly and difficult to manufacture because the phase structure must be closely related to the specific geometries of the chromium pattern. The geometry of the phase-shifting pattern must be calculated specifically and verified by actual experiment since heretofore no design rules or developing guidelines for mask design are available.

In addition, phase-shifting masks cannot be implemented satisfactorily for special geometries, e.g. for the end of large line groups, so that their applicability is limited.

Finally, the fabrication of defect free phase-shifting patterns is a key problem for industrial use of the phase-shift techniques. This problem calls for a suitable technology in respect of defect finding and repair.

Besides the resolution of imagery, the depth-of-focus (DOF) is a major concern in photolithography techniques. Several methods to improve the DOF has been proposed already. A particular approach consists in using a topographical mask which comprises a transparent layer having a refractive index greater than unity. The basic idea of this approach is increasing the optical path between the mask and the projection lens. The actual DOF only is increased with the use of such a topographical mask. No other improvement concerning resolution or exposure latitude is obtained however. In addition, the applicability of topographical masks is limited. For instance, such a mask cannot be applied to short frequency steps of the topology.

Another approach for improving the resolution and the depth-of-focus consists in performing off-axis illumination. By using a costly specially designed illumination system, the incident light beam is caused to be oblique to the mask. An improvement in DOF is obtained with periodic structures extending parallel to the x- or y-axis. With other structures which extend at an angle of 45° relative to the coordinates system, off-axis illumination technique does not result in any improvement in resolution.

SUMMARY OF THE INVENTION

It is an object of this invention to provide a novel resolution-enhancing optical structure which overcomes the drawbacks of the state-of-the-art masks used in projection photolithography techniques.

In accordance with the invention there is provided an optical phase structure to be used in registration with a mask in an illumination system including a light source, said mask comprising a transparent glass substrate and a light absorber pattern formed on the frontside of the substrate, said light absorber pattern having distributed opaque features with apertures therebetween, wherein the optical phase structure includes a pattern of distributed transparent features having at least one refractive index, which are related to the distributed opaque features of the light absorber pattern, said phase structure being positioned in the optical path of light between the light source and the absorber pattern thereby to achieve controlled in situ off-axis illumination of the absorber pattern. The phase structure pattern is comprised of a plurality of gratings with a grating frequency, each grating containing a plurality of grating lines having defined shape and orientation. By optimizing the gratings frequency, the shape and the orientation of the grating lines as well as the phase-shift, in situ off-axis illumination of the absorber pattern can be freely adjusted at any angle relative to the optical axis of the optical path.

The optical phase structure can be positioned in the optical path in registration with the absorber pattern or integrated with the substrate carrying the absorber pattern. In a variation, said optical phase structure can be comprised of a phase hologram or kinoform as well.

A main advantage of the invention over the state-of-the-art conventional off-axis illumination techniques is that this invention allows the angular distribution of the light to the local feature layout to be adjusted individually. Thus, the imaging quality with respect to resolution, depth-of-focus and exposure latitude is optimized. It is emphasized that the invention is applicable to conventional transmission masks as well as to phase-shifting masks without requiring any costly modification of the existing illumination system.

DESCRIPTION OF EMBODIMENTS

Figure 1:
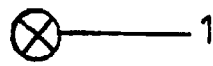
FIG. 1 is a cross-sectional view showing an exemplary embodiment of the invention.
Figure 1:
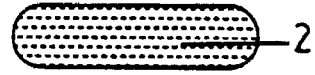

Referring to FIG. 1 there is shown schematically a projection illumination system in which is positioned an optical mask embodying the invention. Reference numeral 1 denotes a light source, numeral 2 denotes the illumination optics, numeral 3 denotes a projection lens and numeral 4 denotes a semiconductor wafer. The mask 10 comprises a transparent glass substrate 11. The frontside of the substrate, which in use is intended to be facing the projection lens 3, is provided with an absorber pattern 12 consisting e.g. of a patterned chromium layer having laterally distributed opaque features with apertures therebetween.

Figure 1B:
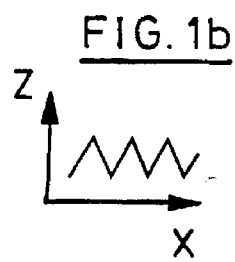
FIGS. 1a and 1b are enlarged views showing two typical grating lines for the optical phase structure used in the device of FIG. 1.
Figure 1A:
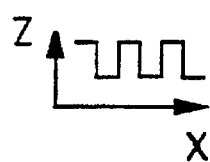
Figure 1A:
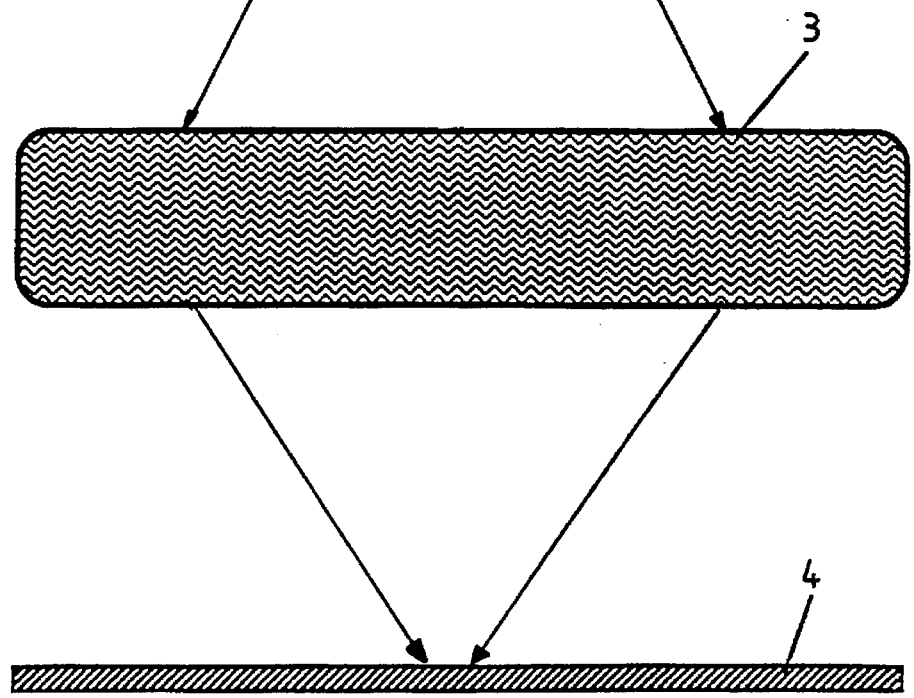

On the backside of the substrate 11 there is formed an optical transparent phase structure 13 intended to be impinged by an illumination light beam 100 from the light source. The pattern of the phase structure 13 contains features whose distribution is related to that of the features of the absorber pattern 12. The phase structure features are defined by a pattern of grating lines and the grating parameters include the grating frequency, the shape and phase distribution of the grating lines and their orientation. FIG. 1a shows an exemplary grating having square-shaped grating lines; FIG. 1b shows a grating having triangle-shaped grating lines.

In use, the incident light beam 100 impinging the phase structure 13 is diffracted for the most part through the structure 13 having at least one refractive index and only a small part of light is transmitted undeviated through the glass substrate 11. The diffracted light includes not only the 0-order and the plus/minus 1st-order lights, but also higher order lights. Properly choosing the grating parameters makes it possible to adjust the light intensity transmitted to the apertures of the absorber pattern 12.

With square-shaped grating lines and a 180° phase shift, the intensity of the 0-order light is set to be zero. Then most of the incident light is diffracted into plus/minus 1st-order diffracted light, i.e. light diffracted at an angle given by:

arc sin $(f_g \cdot \lambda)$ where:

$f_g$ denotes the grating frequency $\lambda$ denotes the wavelength of the diffracted light.

With triangle-shaped grating lines all incident light is diffracted into plus/minus 1st-order diffracted light.

Thus, properly choosing the grating frequency, the phase shift, the incidence angle of diffracted light and the orientation of the grating lines makes it possible to adjust individually the illumination intensity emerging from the mask and accordingly the pattern information to be transmitted onto a semiconductor wafer so that an increase in resolution is obtained for a given depth-of-focus. In practice, the image resolution has shown to be increased up to a factor 2 for any orientation. Accordingly, the invention allows the resolution and DOF to be optimized for each individual pattern using existing illumination system.

Figure 2:
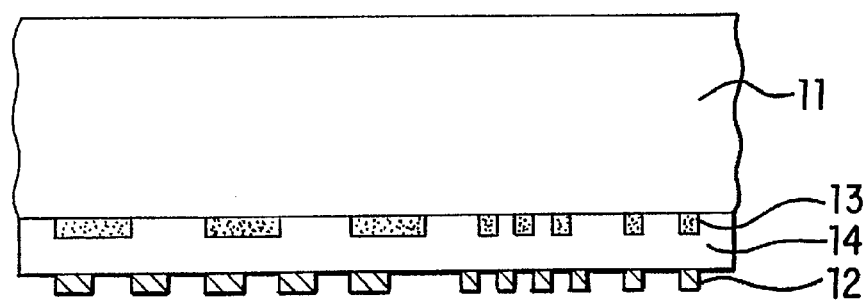
FIGS. 2 to 5 show some alternative embodiments of the device of FIG. 1.

The phase structure of the invention can be arranged in different ways. FIG. 2 shows an embodiment in which the phase structure is comprised of two layers 13–14 having different refractive indices, said layers being formed between the absorber pattern 12 and the glass substrate 11. This implementation provides a shorter distance between the phase grating and the absorber pattern whereby and reduces the extension of shadows between gratings of different orientation on frequencies. The effect of the gratings can thereby be located more accurately.

Figure 3:
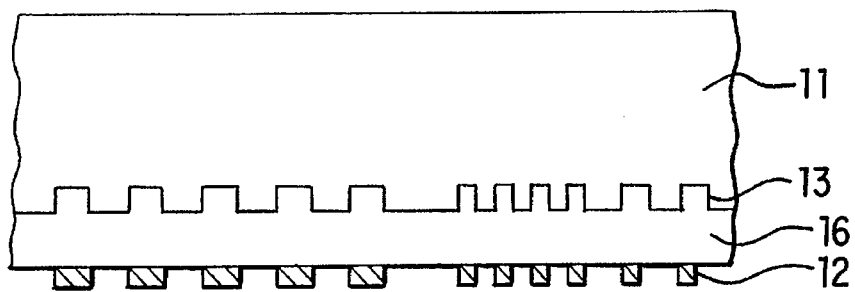
Figure 4:
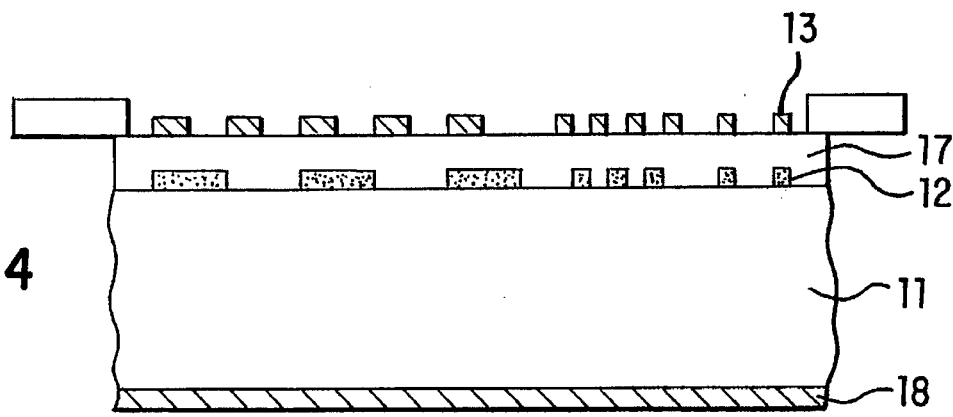

FIG. 3 shows an alternative embodiment in which the optical phase structure 13 is formed or etched in the glass substrate 11 with a transparent layer 16 provided between the phase structure 13 and the absorber pattern 12. The etching depth and the difference in refractive index between glass and grating material define the phase shift as follows:

$\varnothing = 2 \pi^* (n_s - n_g)^* p/\lambda$ where:

$n_s$ denotes the refractive index of glass, $n_g$ denotes the refractive index of grating, p denotes the etching depth FIG. 4 shows another embodiment in which the optical phase structure 13 is provided on an intermediate layer 17 covering the absorber pattern 12. The backside of the glass substrate 11 is covered with an anti-reflex layer 18 which is adapted to exhibit a high transmittance for the imaging actinic light as well as for the surrounding light to be used for alignement purposes. This mask is intended to be suspended to the mask holder in a projection system.

Figure 5:
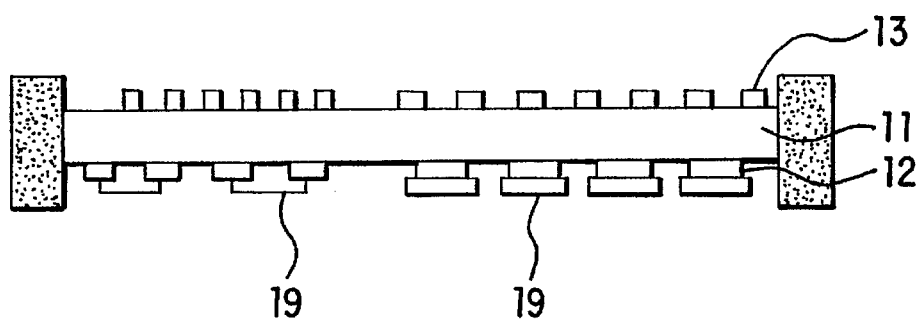

In FIG. 5 there is shown an embodiment similar to the embodiment of FIG. 1, in which the glass substrate is replaced by a thin foil of transparent material having a high mechanical stability. The phase structure 13 is provided on the backside of the foil and the light absorber pattern 12 that is provided on the frontside is covered with a phase-shifting pattern 19.

Exemplary arrangements for the optical phase structure 13 will now be described with reference to FIGS. 6 to 10.

Figure 6:
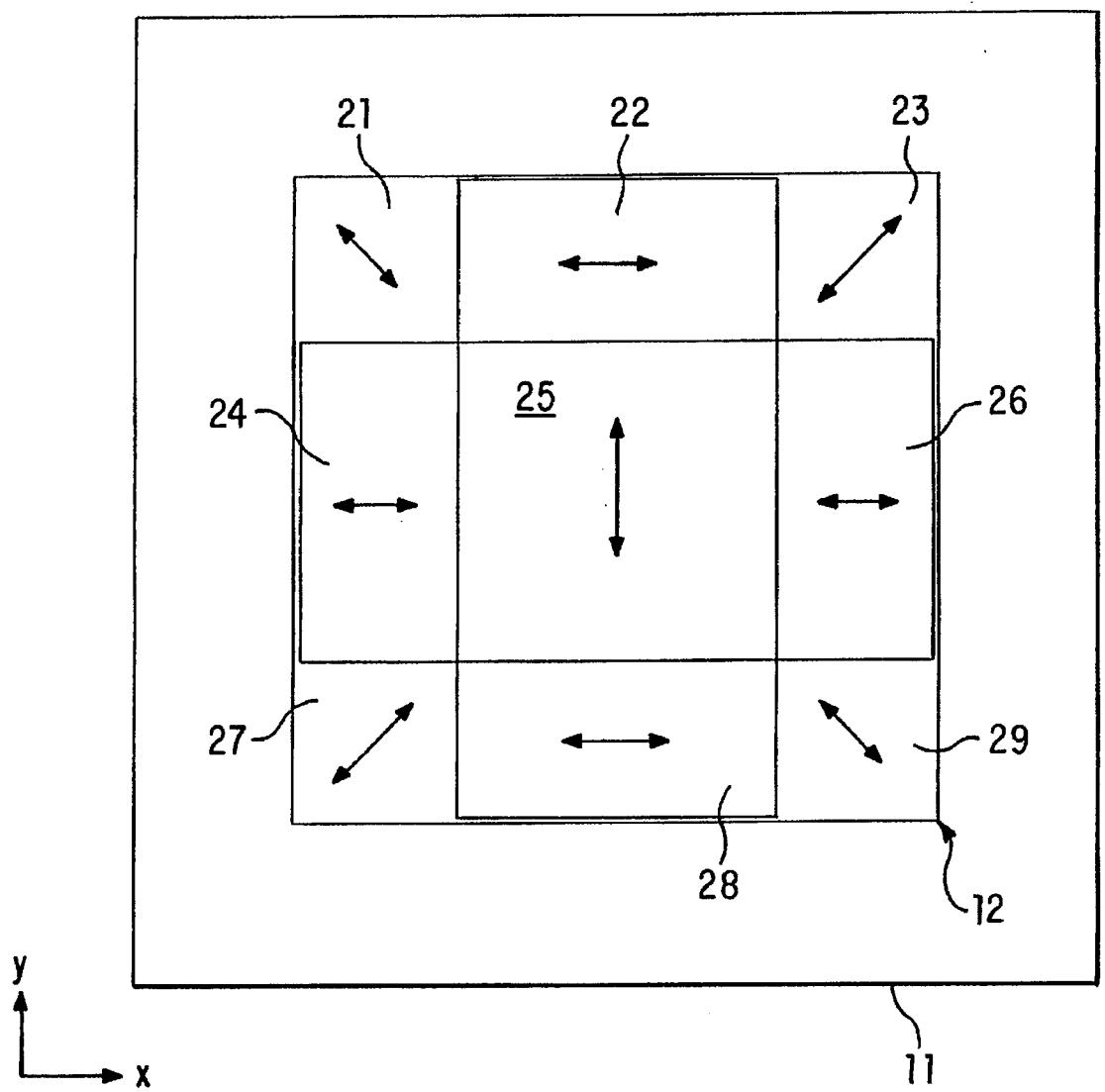
FIG. 6 shows a first exemplary arrangement for the features of the light absorber pattern.
Figure 6B:
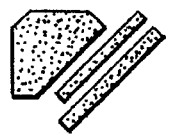
FIGS. 6a and 6b are enlarged views showing two exemplary resolution critical features for the pattern of FIG. 6.
Figure 6A:
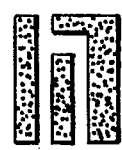

FIG. 6 shows an exemplary arrangement for the features in the light absorber pattern 12. The surface of the pattern is subdivided into several quadrangular active sub-areas denoted 21 to 29. In each active sub-area the resolution critical feature lines have an individual orientation. The arrows shown in the active sub-areas indicate the orientation of the resolution critical feature lines. Exemplary resolution critical features for the active sub-areas 25 and 27 are shown in FIGS. 6a and 6b respectively.

Figure 7:
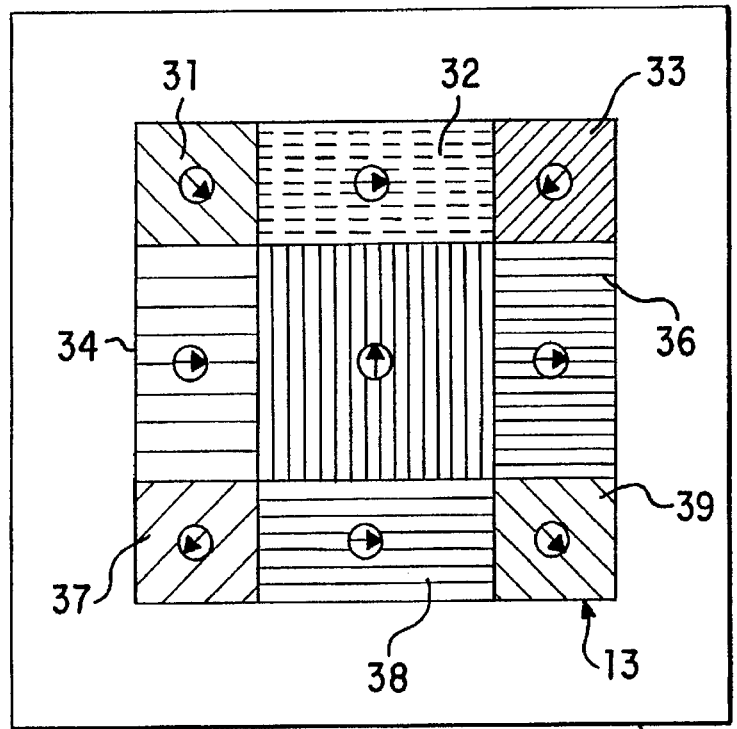
FIGS. 7 and 8 show two exemplary arrangements for the phase structure in use with the pattern of FIG. 6.
Figure 8:
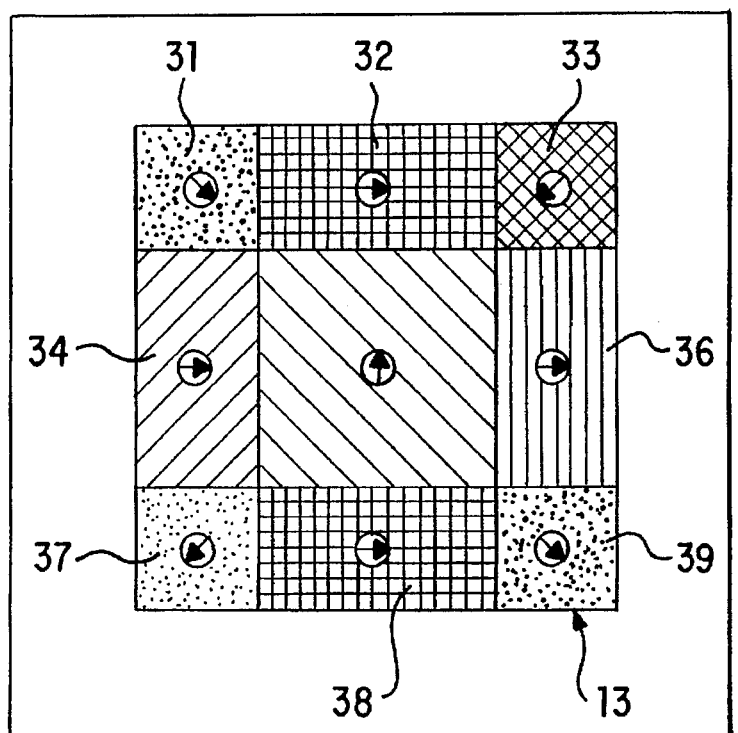

FIGS. 7 and 8 show two exemplary embodiments for the phase structure 13 according to the invention for use in conjunction with the resolution feature pattern of FIG. 6. It is seen that both phase structures are sub-divided into active sub-areas 31–39 which are arranged in harmony with the sub-areas 21–29 in the pattern of FIG. 6. In the embodiment of FIG. 7 the active sub-areas are arranged with grating lines, the orientations of which are indicated by the arrows. Instead of linear gratings, the active sub-areas may be provided with crossgratings as well. FIG. 8 shows an example of crossgrating arrangement.

Figure 9:
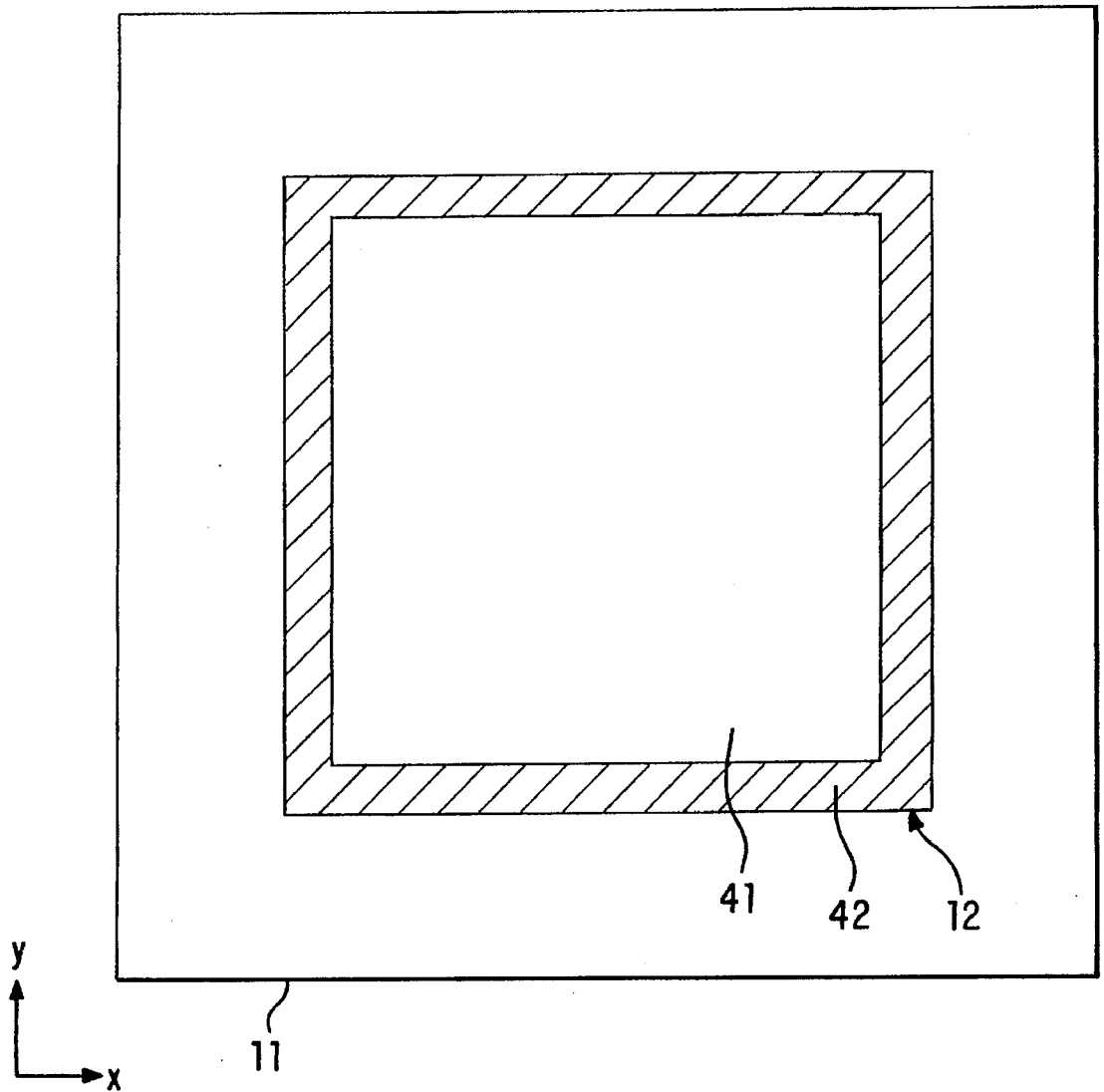
FIG. 9 shows a second exemplary arrangement for the features of the light absorber pattern.
Figure 9A:
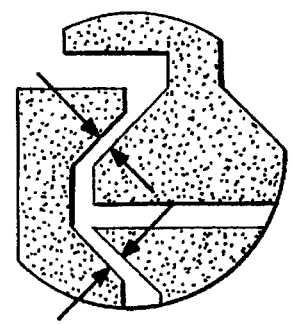
FIG. 9a is an enlarged view showing an exemplary resolution critical feature for the pattern of FIG. 9.

Now referring to FIG. 9 there is shown an alternative embodiment for the light absorber pattern 12. The surface of the pattern comprises a central square area 41 having resolution critical features therein and a surrounding area 42 having no resolution critical features therein. FIG. 9a is an enlarged view of an exemplary resolution critical feature for the active area 41. The resolution critical features are oriented at 45° to the x- and y-directions. The dimensions in the x- and y-directions are not critical.

Figure 10:
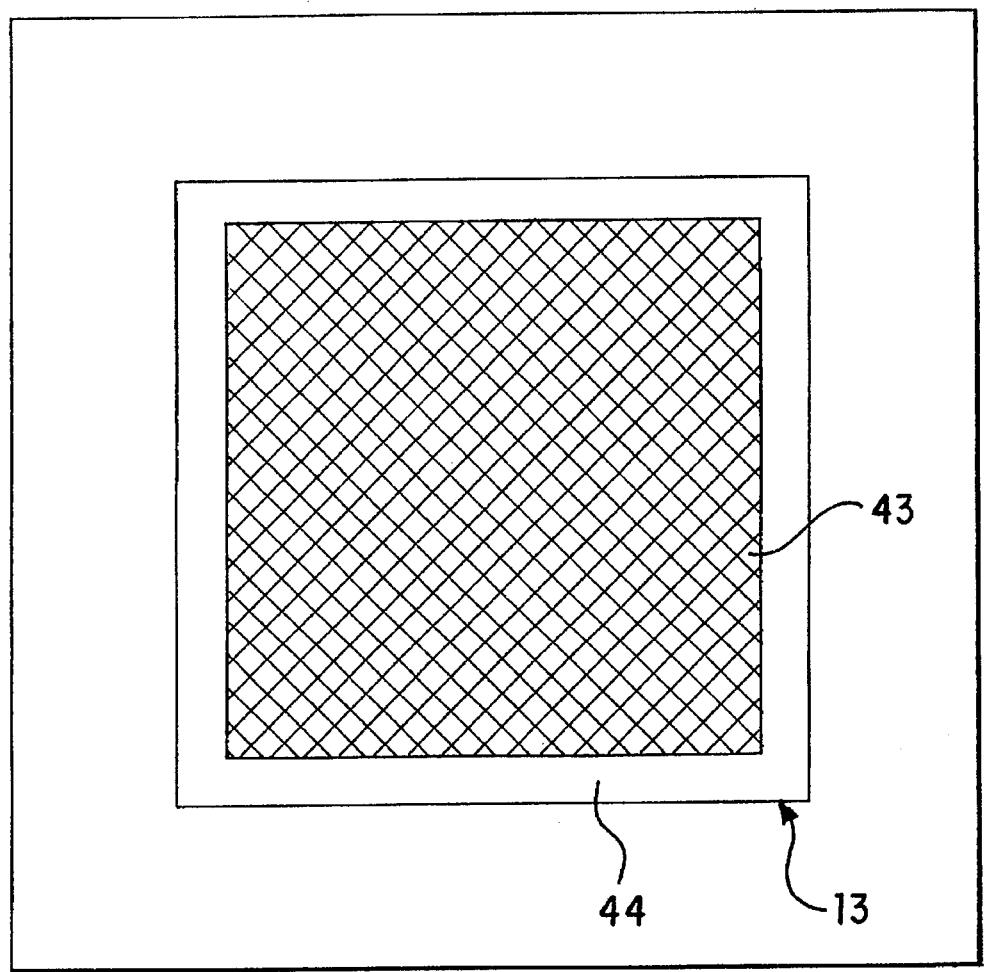
FIG. 10 shows an exemplary crossgrating arrangement for the phase structure in use with the pattern of FIG. 9.
Figure 10A:
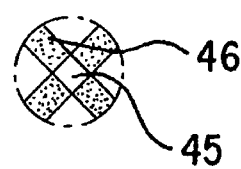
FIG. 10a is an enlarged view of a detailed portion of the crossgrating shown in FIG. 10.

FIG. 10 shows an exemplary embodiment for the phase structure according to the invention for use in conjunction with the resolution feature pattern of FIG. 9. The surface of the phase structure 13 is arranged in harmony with the surface of the pattern of FIG. 9. The active area 43 consists of a chessboard-like crossgrating as shown more particularly in FIG. 10a. It can be seen that the crossgrating is oriented at an angle of 45° to the x- and y-directions. This crossgrating includes features 45 and 46 which provide a phase difference of 180 degrees. A light beam incident upon this crossgrating is subdivided into four main beams, which are oblique to the optical axis. The required optimum angles are defined by the grating frequency. In the area 44 no phase feature distribution is provided.

In the embodiments described in the foregoing, the optical phase structure 13 of the invention is implemented together with the optical mask including the absorber pattern 12. However, said optical phase structure can be fabricated separately as well and used in conjunction with a state-of-the-art optical mask, either a conventional transmission mask or a phase-shifting mask, both known per se.

Figures 11, 11A:
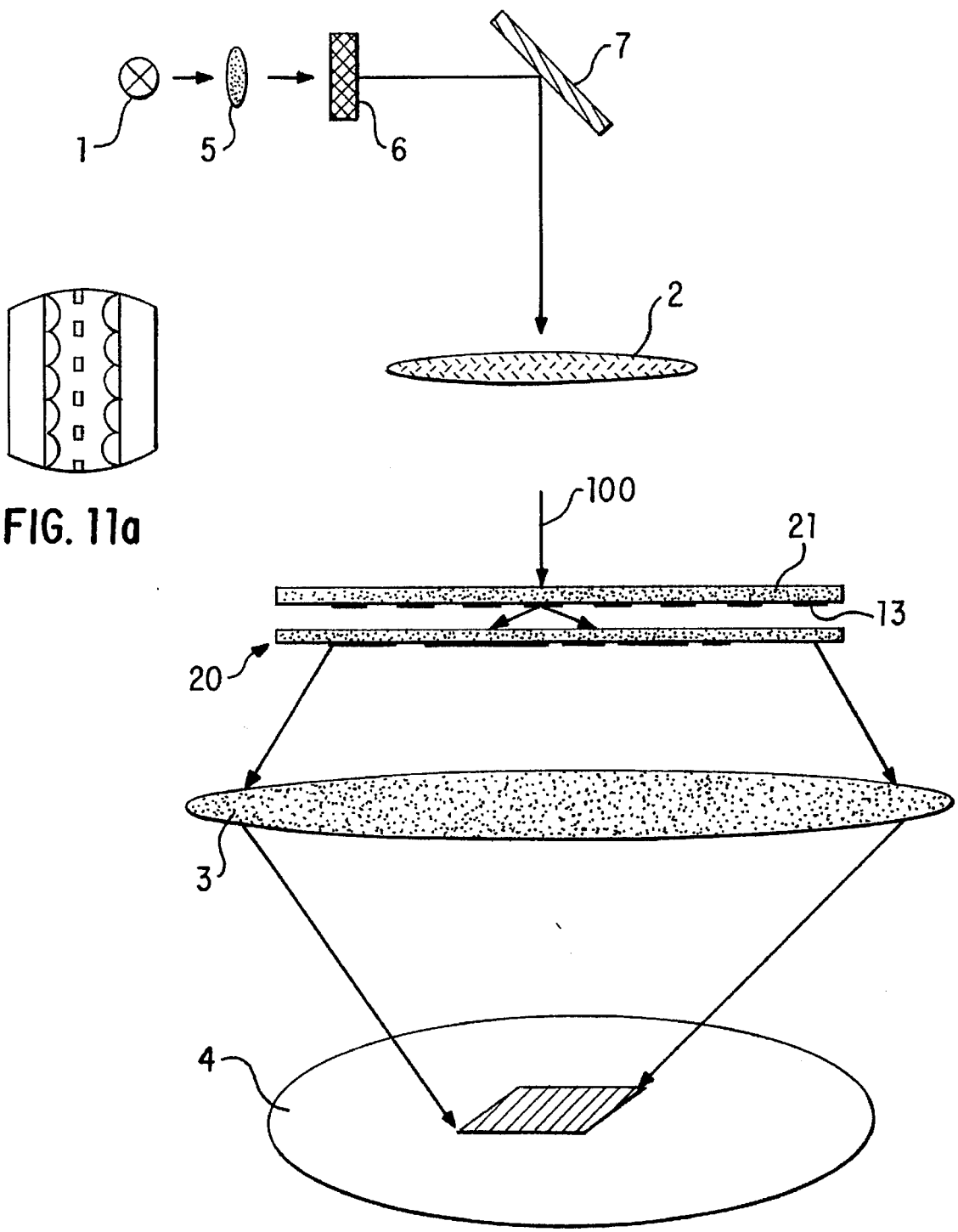
FIG. 11 depicts a projection illumination system including a first exemplary alternative embodiment for the optical phase structure of the invention.
FIG. 11a is an enlarged partial view of the light condenser used in the system shown in FIG. 11.

FIG. 11 illustrates an embodiment using an optical phase structure in accordance with the invention positioned on the light path of a light beam 100, in registration with a known mask 20. FIG. 11 schematically depicts the illumination system of a waferstepper, comprising a light source 1, a collimator 5, a condenser 6 comprised of an assembly of several lenses as shown in particular in FIG. 11a, a reflection mirror 7, a field lens 2 and the projection lens 3. In the optical path of the system between the field lens 2 and the projection lens 3 there is positioned a conventional mask 20 having a light absorber pattern 12 formed thereon. The features contained in the pattern 12 are reduced by the projection lens onto the semiconductor wafer 4. The optical phase structure 13 according to this invention is provided on a glass plate 21 maintained in position by suspension means (not shown).

It is within the scope of this invention to perform the phasing operation of the phase structure according to the invention using a phase hologram or a kinoform which can be achieved either by any method of coherently superimposing light structures or by binary coding information.

Figure 12:
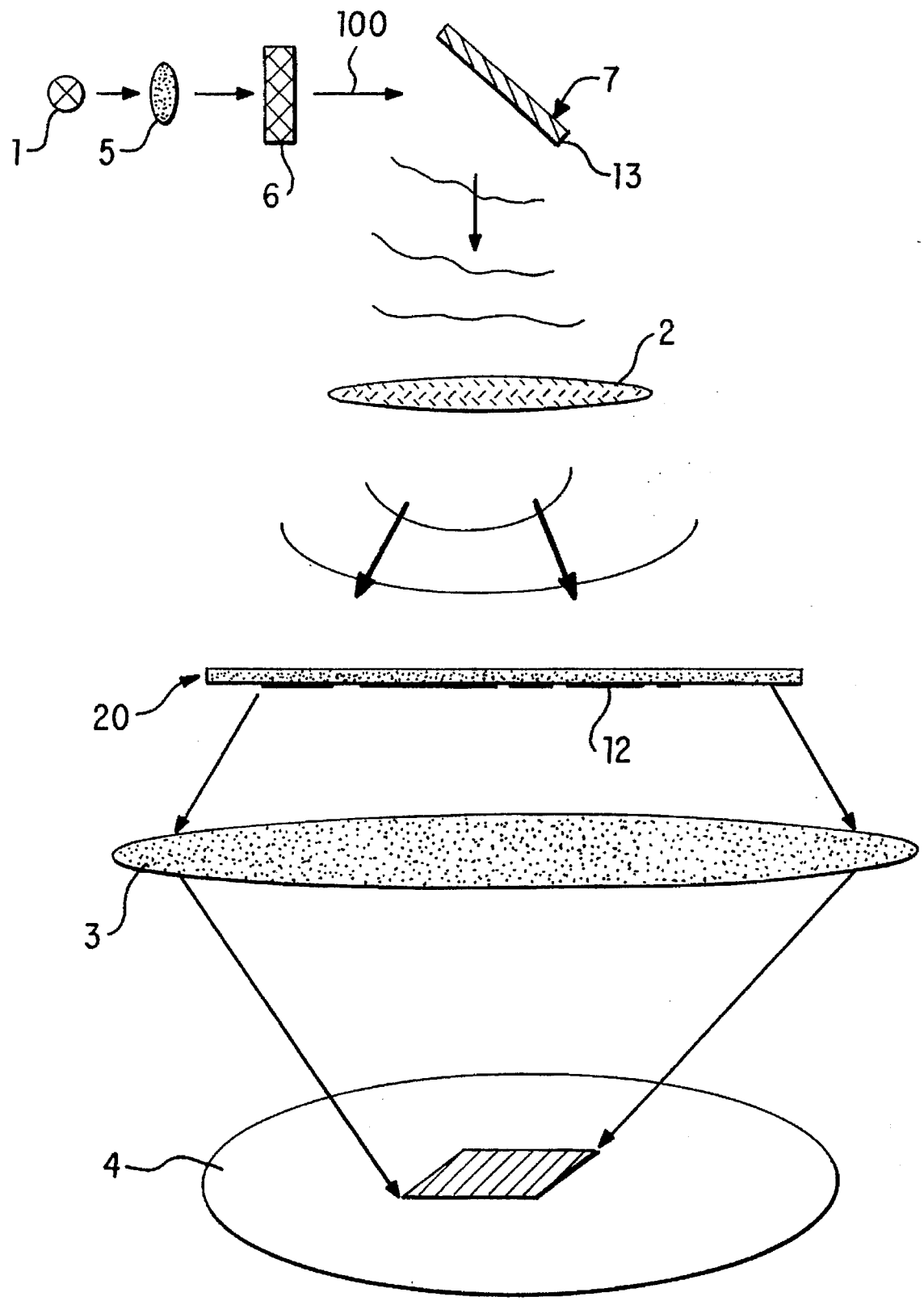
FIG. 12 depicts a projection illumination system including a second exemplary alternative embodiment for the optical phase structure of the invention.

FIG. 12 illustrates schematically a projection illumination system in which the phase structure is included in the reflection mirror 7 to produce a reflecting hologram effective in order to modify the incident light beam 100 from the light source so as to transmit the desired distribution of lights to a known mask 20.

The embodiments of the invention described in the foregoing are examples given by way of illustration and the invention is nowise limited thereto. Any modification, variation and equivalent arrangement should be considered as being included within the scope of the invention.

We claim:

1. An optical projection system for use in projection printing of masks to wafers, comprising an illumination system including a light source, an optical mask positioned in the optical path of the illumination system, said mask comprising a transparent substrate and a light absorber pattern having distributed opaque feature with apertures therebetween for allowing light to pass therethrough, and projection lens means for collecting and focusing the light passing through said apertures, and an optical phase structure positioned in the optical path between the light source and the light absorber pattern, said phase structure comprising a plurality of gratings with a grating frequency, each grating containing a plurality of grating lines having defined shape and orientation with a defined line width therebetween and having at least one refractive index, said plurality of gratings of said phase structure being locally related in position and orientation to the opaque features of the light absorber pattern thereunder.

2. The optical phase structure defined in claim 1, wherein the gratings have different frequencies.

3. The optical phase structure defined in claim 1, wherein the gratings have different lateral extensions.

4. The optical phase structure defined in claim 1, wherein the grating lines in the individual gratings have a different orientation.

5. The optical phase structure defined in claim 1, wherein said optical phase structure is provided on the transparent substrate of the optical mask.

6. The optical phase structure defined in claim 1, wherein said optical phase structure is formed in the transparent substrate of the optical mask.

7. The optical phase structure defined in claim 1, wherein said optical phase structure covers a transparent layer which in turn is formed on the light absorber pattern formed on a transparent substrate.

8. The optical phase structure defined in claim 1, wherein said optical phase structure is arranged in a reflection mirror.

9. The optical phase structure defined in claim 1, wherein said optical phase structure consists of a phase hologram.

10. An optical mask comprising a transparent substrate, a light absorber pattern provided on the frontside of the transparent substrate, said light absorber pattern comprising distributed opaque features with apertures therebetween, and an optical phase structure comprising a plurality of gratings with a grating frequency, each grating containing a plurality of grating lines having defined shape and orientation with a defined line width therebetween and having at least one refractive index, said plurality of gratings of said phase structure being locally related in position and orientation to the opaque features of the light absorber pattern thereunder.

11. The optical mask of claim 10, wherein the gratings have different frequencies.

12. The optical mask of claim 10, wherein the gratings have different lateral extensions.

13. The optical mask of claim 10, wherein the grating lines in the individual gratings have different orientation.

14. The optical mask according to claim 10, wherein the optical phase structure is provided on the backside of the transparent substrate.

15. The optical mask according to claim 10, wherein the optical phase structure is formed in the transparent substrate.

16. The optical mask according to claim 10, wherein the optical phase structure is formed on a transparent layer covering the light absorber pattern.

* * * * *